(12) United States Patent
Gostyuzhev

(10) Patent No.: US 11,323,147 B1
(45) Date of Patent: May 3, 2022

(54) REDUCING INSERTION LOSS IN A SWITCH FOR A COMMUNICATION DEVICE

(71) Applicant: Futurecom Systems Group, ULC, Vaughn (CA)

(72) Inventor: Sergey Gostyuzhev, Ontario (CA)

(73) Assignee: Futurecom Systems Group, ULC, Vaughn (CA)

( * ) Notice: Subject to any disclaimer, the term of this patent is extended or adjusted under 35 U.S.C. 154(b) by 0 days.

(21) Appl. No.: 17/340,880

(22) Filed: Jun. 7, 2021

(51) Int. Cl.
*H04B 1/52* (2015.01)
*H04B 1/401* (2015.01)
*H04B 1/00* (2006.01)
*H03K 17/693* (2006.01)

(52) U.S. Cl.
CPC ............. *H04B 1/52* (2013.01); *H04B 1/006* (2013.01); *H04B 1/401* (2013.01); *H03K 17/693* (2013.01)

(58) Field of Classification Search
CPC .......... H04B 1/52; H04B 1/006; H04B 1/401; H03K 17/693
See application file for complete search history.

(56) References Cited

U.S. PATENT DOCUMENTS

| | | | |
|---|---|---|---|
| 1,584,220 A | 5/1926 | Farkouh | |
| 2,486,536 A | 11/1949 | Olson | |
| 3,475,700 A * | 10/1969 | Alfred | G01S 7/034 257/458 |
| 3,711,793 A * | 1/1973 | Stachejko | H01P 1/15 333/13 |
| 4,480,338 A * | 10/1984 | Dobrovolny | H03H 7/1758 455/190.1 |
| 4,817,200 A * | 3/1989 | Tanbakuchi | H03J 3/16 455/337 |
| 5,533,097 A | 7/1996 | Crane et al. | |
| 5,590,022 A | 12/1996 | Harvey | |
| 5,594,394 A * | 1/1997 | Sasaki | H01Q 21/30 333/202 |
| 5,634,200 A * | 5/1997 | Kitakubo | H01P 1/15 333/132 |

(Continued)

FOREIGN PATENT DOCUMENTS

| | | |
|---|---|---|
| CA | 2736083 A1 | 9/2012 |
| EP | 1916738 A1 | 4/2008 |

OTHER PUBLICATIONS

Stratus Lite Repeater, Jun. 2017, 2 pages, Issue 2, 12-20314-EN, Codan Radio Communications.

*Primary Examiner* — Jinsong Hu
*Assistant Examiner* — Rui M Hu
(74) *Attorney, Agent, or Firm* — Maynard Cooper & Gale, P. C.; Brian T. Sattizahn

(57) ABSTRACT

A switch is provided for a communication device operating in the RF or microwave frequency range. The switch can include one or more PIN diodes and a biasing circuit that includes one or more inductors. When operating at RF and/or microwave frequencies, the switch can be configured as a low pass filter using the parasitic inductances and capacitances of the PIN diodes and inductors to minimize the insertion loss of the switch. The parasitic capacitances for the low pass filter can be provided by operating the inductors of the switch above their self-resonant frequency such that the inductors operate like capacitors. The parasitic inductances for the low pass filter can be provided by the PIN diodes.

18 Claims, 6 Drawing Sheets

(56) References Cited

U.S. PATENT DOCUMENTS

| | | | | |
|---|---|---|---|---|
| 5,770,940 | A * | 6/1998 | Goder | H02M 3/156 323/285 |
| 5,781,563 | A * | 7/1998 | Schalamon | G06F 11/20 700/29 |
| 5,789,995 | A * | 8/1998 | Minasi | H04B 1/48 333/262 |
| 5,903,548 | A | 5/1999 | Delamater | |
| 5,914,544 | A * | 6/1999 | Tanaka | H04B 1/48 455/199.1 |
| 6,134,105 | A | 10/2000 | Lueker | |
| 6,198,288 | B1 * | 3/2001 | Gauss | G01R 33/3628 324/318 |
| 6,496,083 | B1 * | 12/2002 | Kushitani | H01P 1/15 333/132 |
| 6,560,444 | B1 * | 5/2003 | Imberg | H04B 1/48 333/245 |
| 7,129,805 | B2 * | 10/2006 | Marion | H01P 1/15 333/103 |
| 7,391,283 | B2 * | 6/2008 | Kearns | H01P 1/15 333/262 |
| 8,428,573 | B2 | 4/2013 | Martz et al. | |
| 8,583,065 | B2 * | 11/2013 | Ben-Bassat | H04B 1/18 455/197.3 |
| 8,593,358 | B2 | 11/2013 | Rappaport | |
| 8,594,611 | B2 | 11/2013 | Chauhan et al. | |
| 8,937,816 | B2 | 1/2015 | Trombino | |
| 9,026,041 | B2 | 5/2015 | Forster | |
| 9,293,808 | B1 | 3/2016 | Roberts et al. | |
| 10,115,510 | B2 * | 10/2018 | Keller | H01F 5/02 |
| 10,200,031 | B2 * | 2/2019 | Forstmaier | H03K 17/693 |
| 10,505,574 | B2 | 12/2019 | Kolanski et al. | |
| 10,629,972 | B2 * | 4/2020 | Kuo | H04B 1/005 |
| 2002/0100970 | A1 * | 8/2002 | Kitazawa | H01P 1/15 257/724 |
| 2002/0137471 | A1 * | 9/2002 | Satoh | H04B 1/406 455/553.1 |
| 2004/0032706 | A1 * | 2/2004 | Kemmochi | H04B 1/48 361/306.3 |
| 2004/0061578 | A1 * | 4/2004 | Vice | H01P 1/15 333/262 |
| 2004/0092285 | A1 * | 5/2004 | Kodim | H01P 5/04 343/702 |
| 2004/0127182 | A1 * | 7/2004 | Hayashi | H04B 1/0057 455/193.1 |
| 2004/0157579 | A1 * | 8/2004 | Namura | H04B 1/005 455/326 |
| 2004/0242165 | A1 * | 12/2004 | Jedeloo | H04B 1/48 455/73 |
| 2004/0266378 | A1 * | 12/2004 | Fukamachi | H04B 1/406 455/188.1 |
| 2005/0035824 | A1 * | 2/2005 | Kearns | H01P 1/15 333/126 |
| 2005/0048927 | A1 * | 3/2005 | Kemmochi | H01P 1/15 455/73 |
| 2005/0077980 | A1 * | 4/2005 | Watanabe | H03H 7/46 333/126 |
| 2006/0017607 | A1 * | 1/2006 | Hayata | G01S 7/282 342/134 |
| 2006/0170516 | A1 * | 8/2006 | Marion | H01P 1/15 333/104 |
| 2006/0245382 | A1 * | 11/2006 | Hayashi | H04B 1/44 370/297 |
| 2007/0018753 | A1 * | 1/2007 | Poveda | H04B 1/005 333/103 |
| 2007/0026836 | A1 * | 2/2007 | Chow | H03J 5/244 455/333 |
| 2007/0232228 | A1 | 10/2007 | McKay | |
| 2007/0241155 | A1 | 10/2007 | Trajkovic et al. | |
| 2008/0181282 | A1 | 7/2008 | Wala et al. | |
| 2009/0077608 | A1 * | 3/2009 | Romerein | H04N 7/102 725/127 |
| 2010/0289597 | A1 * | 11/2010 | Wolfe | H01P 5/12 333/104 |
| 2012/0068899 | A1 | 3/2012 | Ayotte et al. | |
| 2014/0120968 | A1 * | 5/2014 | Mahmood | H04B 1/44 343/745 |
| 2014/0124908 | A1 * | 5/2014 | Sameshima | H01P 1/15 257/664 |
| 2014/0125545 | A1 * | 5/2014 | Forster | H03G 11/002 333/81 R |
| 2016/0261267 | A1 * | 9/2016 | Liu | H01L 29/868 |
| 2017/0040996 | A1 * | 2/2017 | Zhao | H03K 17/693 |
| 2017/0302269 | A1 * | 10/2017 | Forstmaier | H03K 17/74 |
| 2017/0345620 | A1 * | 11/2017 | Coumou | H03F 3/217 |
| 2018/0013425 | A1 * | 1/2018 | Foley | H03K 17/74 |
| 2019/0074857 | A1 | 3/2019 | Kolanski et al. | |
| 2019/0110021 | A1 * | 4/2019 | Bailey | H04N 7/104 |
| 2020/0144032 | A1 * | 5/2020 | Ulrich | H01L 21/28556 |
| 2020/0279844 | A1 * | 9/2020 | Brogle | H03K 17/74 |
| 2021/0135326 | A1 * | 5/2021 | Puente | H03K 17/74 |
| 2021/0152208 | A1 * | 5/2021 | Moreschi | H03H 7/255 |

* cited by examiner

REDUCING INSERTION LOSS IN A SWITCH FOR A COMMUNICATION DEVICE

BACKGROUND

The present application generally relates to a switch for a communication device. More specifically, the present application is directed to reducing insertion loss in a switch for a communication device operating in the RF (radio frequency) and microwave frequency bands.

Communication devices may incorporate semiconductor switches (or switching circuits) to control signal paths in the device. For example, the communication device may include a switch that permits RF (radio frequency) or microwave signals to travel between an antenna and either a transmitter or a receiver. Frequently, the design of the switches can include PIN diodes.

PIN diodes can be commonly used in switching circuits for RF or microwave signals. A PIN diode is a semiconductor device that operates similar to a variable resistor at RF and microwave frequencies. The resistance value of the PIN diode is determined by the biasing DC current applied to the PIN diode. When the PIN diode is forward biased (e.g., receiving a positive voltage) its equivalent resistance is low and the PIN diode allows RF energy to flow between its connection points. When the PIN diode is reverse biased (e.g., receiving a negative voltage) its equivalent resistance is high and the PIN diode blocks RF energy from flowing between its connection points.

One of the most important parameters of any switch, such as an RF switch, is the insertion loss. The insertion loss (at lower frequencies) for a switch having a matched impedance condition can be determined by the equation: $IL=20*\log 10(1+Rs/2*Z0)$, where Rs is the forward resistance of the PIN diode in the switch and Z0 is the characteristic or reference impedance of a transmission line connected to the switch (e.g., 50Ω). A reduction of the insertion loss can increase the output power of a transmitter or improve the sensitivity of a receiver. At low signal frequencies, the PIN diode can have a small forward resistance and a small reactance from the parasitic inductor, which reactance can be ignored when determining the insertion loss of the switch and evaluating the performance of the communication device. However, at higher signal frequencies, such as RF and microwave frequencies, the reactance of the parasitic inductor of the PIN diode can be much larger resulting in the switch having a much larger insertion loss that can introduce noise into the signal, reduce the sensitivity of the receiver, dissipate heat at the transmitter and affect the overall performance of the communication device.

To address the increased insertion loss (and corresponding noise) caused by the parasitic inductance of the PIN diodes in the switches of the communication device when operating at higher frequencies, additional circuitry can be introduced into the communication device to mitigate the effects of the insertion loss from the PIN diodes. One type of circuit that can be used to mitigate the effects of insertion loss is to include an additional circuit (e.g., an external capacitor that forms a series resonant circuit with the parasitic inductor) that operates at a resonant frequency such that the insertion losses from the reactance of the parasitic inductor can be reduced (but not fully removed). However, the addition of circuitry into the communication device to mitigate insertion loss results in a narrow-band solution and can increase the complexity and cost of the communication device. Further, with a reduction in size of the package for a PIN diode, additional problems can be introduced, such as a high cost of parts, difficulties with installation of the smaller parts (e.g., the PIN diodes and additional circuitry) on a circuit board, and the cooling of the high power PIN diodes.

SUMMARY

The present application is directed to a switch for a communication device operating in the RF or microwave frequency range. The switch can include one or more PIN diodes and a biasing circuit that includes one or more inductors. When operating at RF and/or microwave frequencies, the switch can be configured as a low pass filter using parasitic inductances and capacitances of the PIN diodes and inductors of the switch to minimize the insertion loss of the switch. The low pass filter of the switch can include parasitic inductances in series and parasitic capacitances in parallel. The parasitic capacitances for the low pass filter can be provided by operating the inductors of the switch above their self-resonant frequency such that the inductors operate like capacitors. The parasitic inductances for the low pass filter can be provided by the PIN diodes. The formation of the low pass filter in the switch removes the parasitic inductances and parasitic capacitances from the insertion loss determination.

One advantage of the present application is that it provides a low insertion loss for a switch made from PIN diodes at RF and microwave frequencies.

Another advantage of the present application is it provides a reduction in the number of parts (and the cost of the parts) needed for a switch and simplifies assembly of the switch on a circuit board.

Still another advantage of the present application is that provides a wide bandwidth for signals through the switch.

Other features and advantages of the present application will be apparent from the following more detailed description of the identified embodiments, taken in conjunction with the accompanying drawings which show, by way of example, the principles of the application.

BRIEF DESCRIPTION OF THE DRAWINGS

Wherever possible, the same reference numbers are used throughout the drawings to refer to the same or like parts.

DETAILED DESCRIPTION

Figure 1:
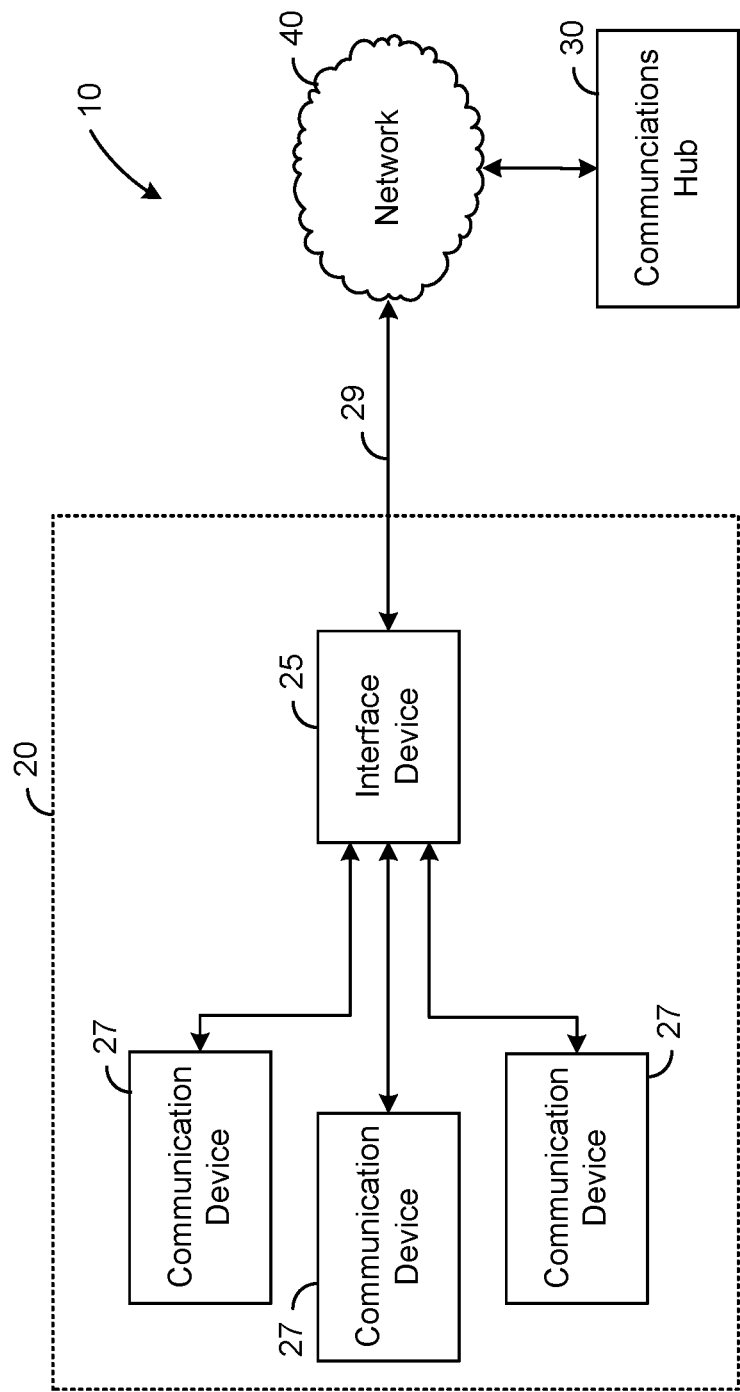
FIG. 1 is a block diagrams showing an embodiment of a communication network.

FIG. 1 shows an embodiment of a communication network 10. The network 10 can include a local network 20 in communication with a communications hub 30 via a network 40. In one embodiment, the network 40 can be a public switched telephone network (PSTN). However, in other embodiments the network 40 can be the Internet and use the transmission control protocol/Internet protocol (TCP/IP) for communication, a cellular network, a local area network (LAN), a wide area network (WAN) or any other type of communication network using one or more communication protocols.

The local network 20 can have one or more interface devices 25 and a plurality of communication devices 27 in communication with the interface device 25 using RF (radio frequency) or microwave communications. However, in other embodiments, other frequencies (e.g., infrared frequencies) can be used for communications. In an embodiment, the interface device 25 can be a portable communication system as described in more detail in U.S. Pat. No. 10,361,737, which is incorporated herein by reference.

In one embodiment, the interface device 25 can communicate with communication devices 27 using any suitable RF or microwave channel, band or frequency such as a HF (high frequency) band (e.g., 3-30 MHz), a VHF (very high frequency) band (e.g., 30-300 MHz including 136 MHz to 174 MHz), a UHF (ultra high frequency) band (e.g., 300-3,000 MHz including 380 MHz to 430 MHz, 450 MHz to 470 MHz, 470 MHz to 512 MHz, 764 MHz to 776 MHz, 794 MHz to 806 MHz, 806 MHz to 824 MHz or 851 MHz to 869 MHz) or a SHF (super high frequency) band (e.g., 3-30 GHz). In other embodiments, the transmissions between the interface device 25 and the communication devices 27 can use the Project 25 (P25) Common Air interface (CAI) standard that specifies the type and content of signals transmitted by the communication devices 27 for digital radio communications. The P25 standard can be used by public services personnel to communicate with each other during emergency situations and in the course of performing their duties. However, in other embodiments, the communications between the communication devices 27 and the interface device 25 can use other suitable standards or communication protocols. In a further embodiment, the communication devices 27 can be 2-way radios configured to communicate with the interface device 25. However, in other embodiments, the communication devices 27 can be any device capable of RF (or microwave) communications such as smartphones, tablet computers and laptop computers. In an embodiment, the interface device 25 can be connected to the network 40 (and the communications hub 30) using an interface 29. In one embodiment, the interface 29 can be a V.24 wireline interface (an ITU standard that defines the functions of all circuits for the RS-232 interface). However, in other embodiments, the interface 29 can use other wired or wireless interfaces to connect the interface device 25 and the network 40.

The communications hub 30 can be located at a remote location from the local network 20 and can include a system infrastructure such that fixed-end equipment (e.g., data interfaces such as conventional channel gateway (CCGW) or digital unit interface (DIU), consoles, voting/comparator system, etc.) and data/software applications (e.g., dispatch applications, location services applications, safety applications, security applications, etc.) at the communication hub 30 can have access to and communicate with the local network 20 and the communication devices 27. In one embodiment, the communications hub 30 can use a digital communication system such as ASTRO® 25 by Motorola Solutions.

Figure 2:
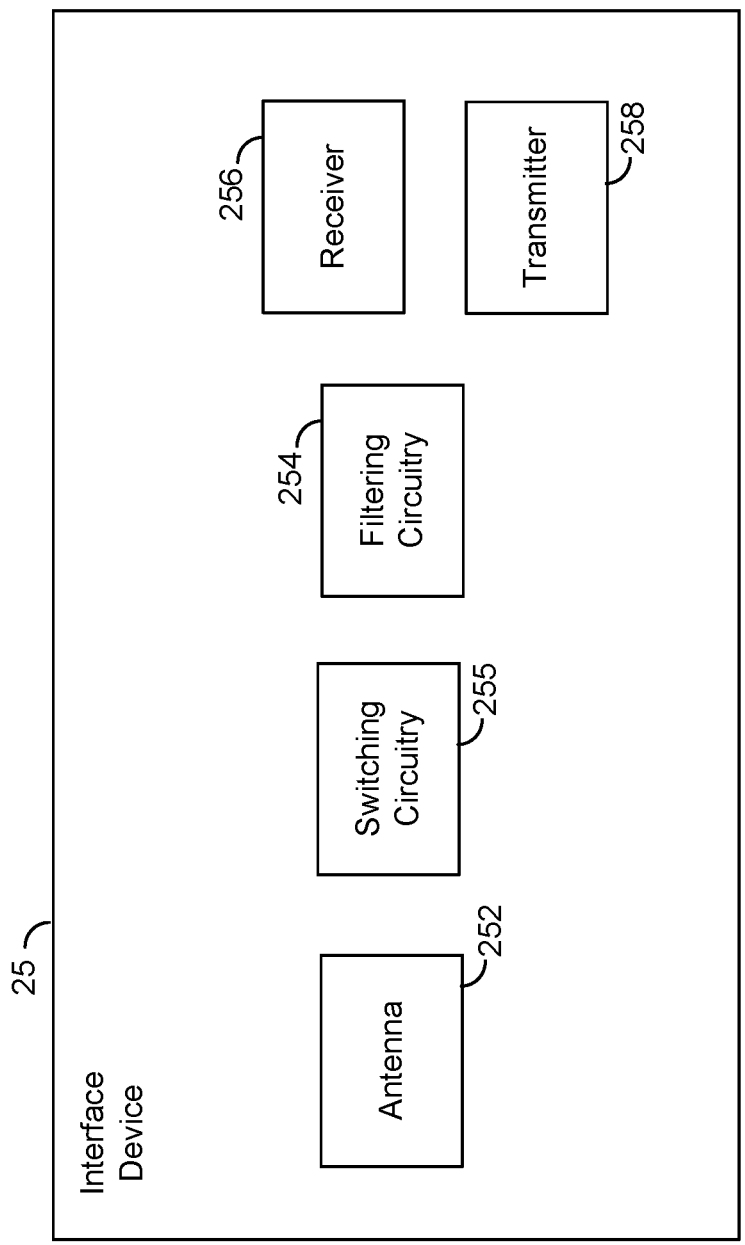
FIG. 2 is a block diagram showing an embodiment of the interface device from FIG. 1.

FIG. 2 shows an embodiment of the interface device 25. The interface device 25 can include one or more antennas 252, filtering circuitry 254, switching circuitry 255, a receiver 256 and a transmitter 258. In an embodiment, the antenna 252 can be connected to the receiver 256 and/or the transmitter 258 via the filtering circuitry 254 and/or the switching circuitry 255. In other embodiments, the receiver 256 and transmitter 258 may be combined into a transceiver and/or the filtering circuitry 254 may be incorporated in the switching circuitry 255. The filtering circuitry 254 may include one or more front end filters in one embodiment, but may include other filters and/or circuits for processing signals in other embodiments. The switching circuitry 255 can be used to select the appropriate signal path between the antenna 252 and either the receiver 256 or the transmitter 258. In addition, the switching circuitry 255 can be used to select different filters in the filtering circuitry 254 to account for different frequency bands and/or signals travelling to the receiver 256 or from the transmitter 258. While the embodiment shown in FIG. 2 includes one each of the antenna 252, the filtering circuitry 254, the switching circuitry 255, the receiver 256 and the transmitter 258, it is to be understood that in other embodiments, the interface device 25 may include more than one of some (or all) of the components shown in FIG. 2 or may omit some of the components shown in FIG. 2. In addition, it is to be understood that the interface device 25 may include additional components (e.g., power connections, network connections, processors, memory devices, etc.), which have been omitted from FIG. 2 for simplicity.

In one embodiment, the interface device 25 can be used for several different operations such as a wireline repeater and base station, a back to back cross band repeater, a standalone repeater and a wireline satellite transmitter or repeater. When used as a wireline repeater and base station, the interface device 25 can be connected to the communications hub 30 by network 40 as shown in FIG. 1 to provide the communications hub 30 access to digital conventional RF channels in local network 20 and support most digital conventional services and site features provided by the communications hub 30.

In another operation, the interface device 25 can be used as a back to back cross band repeater in a communication network to relay signals from one interface device 25 to another interface device 25. In still another embodiment, the interface device 25 can be used as a standalone repeater to provide full-duplex, local repeat capabilities on the configured channel of the local network 20. For example, the interface device 25 can repeat one or more of voice, supplementary data services or packet data services between communication devices 27 in local network 20. When used as a standalone repeater, the interface device 25 is not connected to the network 40 or communications hub 30. In a further operation, the interface device 25 can be used as wireline satellite receiver/transmitter to provide receive-only or transmit-only capabilities to the local network 20. For example, the interface device 25 can be used as part of a voting/comparator system to provide an improved RF coverage solution for local network 20.

Figure 3:
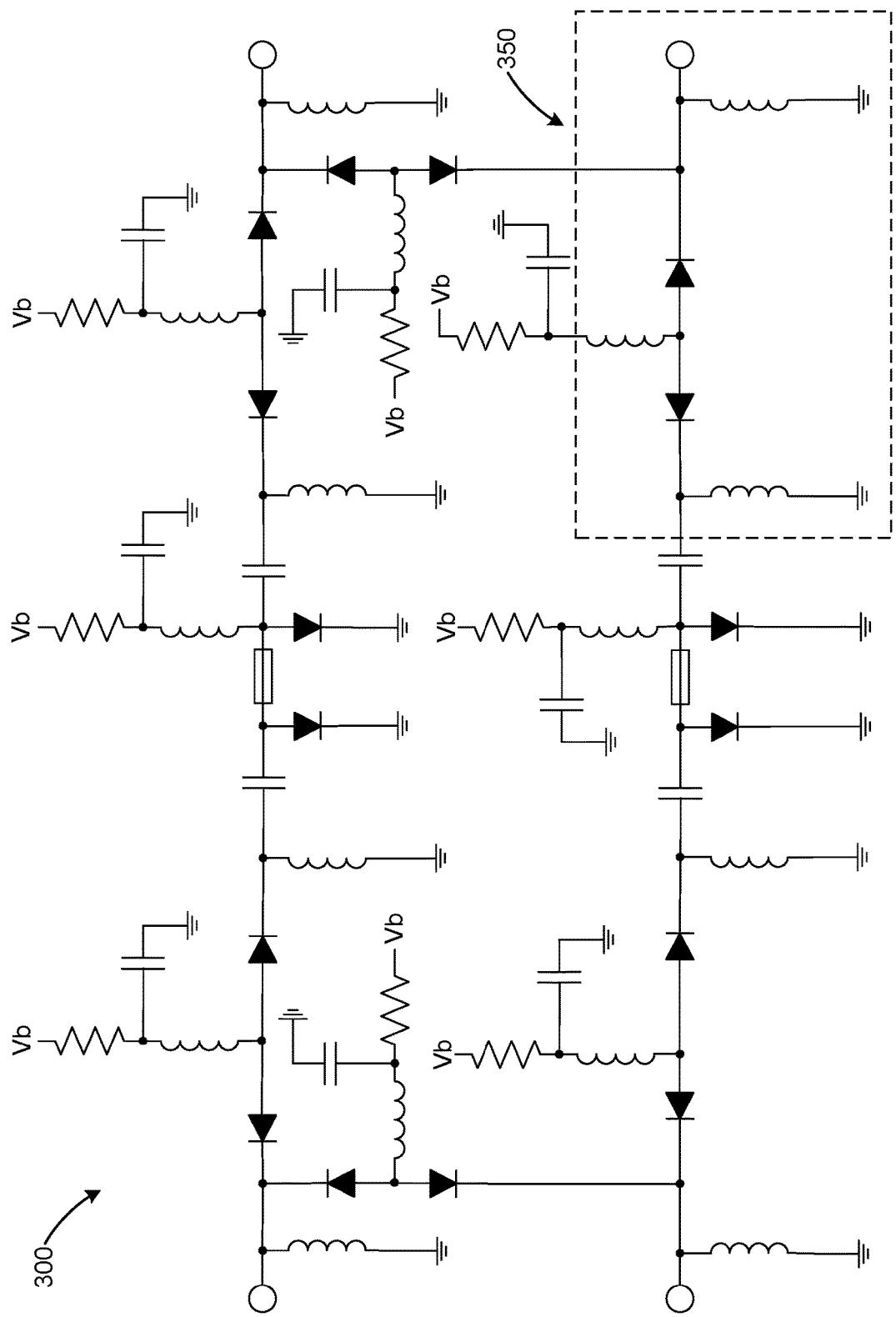
FIG. 3 is a circuit diagram of an embodiment of a switch from the switching circuitry of FIG. 2.

FIG. 3 shows a circuit diagram for an embodiment of a switch that can be incorporated into switching circuitry 255. Switch 300 can be arranged as a double-pole, double-throw (DPDT) switch having numerous inductors, capacitors, resistors and PIN diodes (and/or RF transistors in some embodiments). Each of the inductors, capacitors, resistors and PIN diodes can be configured or have appropriate values to ensure proper operation of the switch. In one embodiment, the switch 300 can be used to connect a receiver input and a transmitter output to two different antennas. In addition, to simplify the building of the switch 300, the switch 300 may incorporate one or more switch modules 350. The switch 300 may include additional components, which have been omitted from FIG. 3 for simplicity. In other embodiments, the switching circuitry 255 may include other types of switches or other components that may be constructed using one or more switch modules 350.

Figure 4:
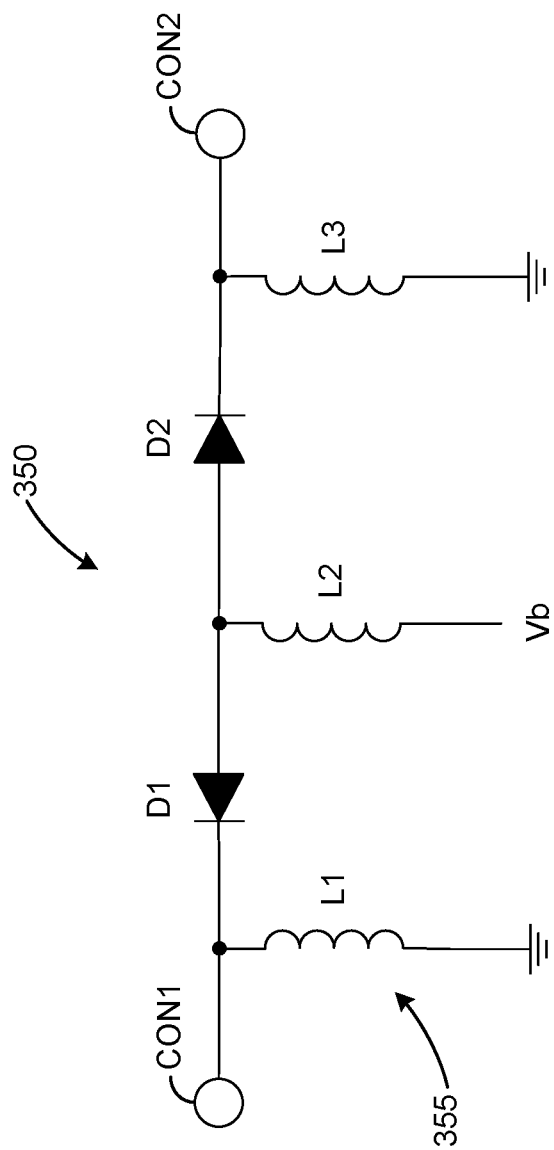
FIG. 4 is a circuit diagram of an embodiment of a switch module from the switch of FIG. 3.

FIG. 4 shows a circuit diagram for an embodiment of a switch module that can be used in switching circuitry 255. The switch module 350 can be arranged as a single-pole, single-throw (SPST) switch (i.e., an On/Off switch) having one or more inductors and one or more PIN diodes connected between two (2) connection points (e.g., an input and output), which may be connected to corresponding transmission lines in an embodiment. As shown in FIG. 4, the switch module 350 can include two (2) PIN diodes D1, D2 connected in series between two (2) connection points CON1, CON2 to achieve better isolation between the connection points CON1 and CON2. The switch module 350 can also include a biasing circuit 355 connected to the PIN diodes D1, D2 to control the bias of each of the PIN diodes D1, D2. The biasing circuit 355 can include three (3) parallel inductors L1-L3 connected to the PIN diodes D1, D2. Inductor L1 can be connected between PIN diode D1 (and connection point CON1) and ground. Inductor L2 can be connected between PIN diodes D1 and D2 and a biasing voltage Vb. Inductor L3 can be connected between PIN diode D2 (and connection point CON2) and ground. The PIN diodes can be current controlled devices when in the "on" state and voltage controlled devices in the "off" state. In one embodiment, the biasing voltage Vb to turn "on" the PIN diodes (and the switch module 350) can be any suitable voltage (e.g., 5 V) greater than the threshold voltage (e.g., 0.6 V) for the PIN diode and the biasing voltage Vb to turn "off" the PIN diodes (and the switch module 350) can be zero volts or a negative voltage (e.g., −70 V). To provide the appropriate voltage to the PIN diodes D1, D2, a current limited resistor (as shown in FIG. 3) has to be connected in series to the biasing voltage Vb. The current limited resistor is used to supply DC current to place the PIN diodes in the "on" state and does not contribute to the operation of the switch module 350 at RF and microwave frequencies. In an embodiment, the series-connected current limited resistor can be optional for the "off" state of the PIN diodes.

Figure 5:
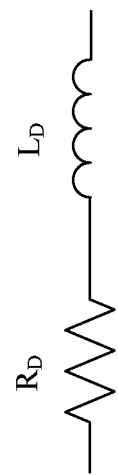
FIG. 5 is a circuit diagram of an embodiment of a model for the diode from the switch module of FIG. 4.

The insertion loss of the switch module 350 can be determined using the resistances, parasitic capacitances and/or parasitic inductances of the PIN diodes D1, D2 and the inductors L1-L3. Each PIN diode D1, D2 can have a resistance ($R_D$) in series with a parasitic inductance ($L_D$) as shown in the equivalent circuit FIG. 5. The resistance ($R_D$) corresponds to the active loss of the PIN diode when in the "on" state (i.e., forward biased) and the parasitic inductance ($L_D$) is determined from the geometrical properties of the package for the PIN diode such as a metal pin length and bonding wires. The resistance ($R_D$) of the PIN diode is a resistance associated with the intrinsic layer (I-region) of the PIN diode. The resistance ($R_D$) has a high value (e.g., thousands of Ohms) when the PIN diode is reverse biased and a low value (e.g., a fraction of an Ohm) when the PIN diode is forward biased. The resistance ($R_D$) may be referred to as a parasitic resistance when the PIN diode is forward biased because the expectation for the PIN diode is to be zero Ohm (or shorted) for the "on" state. In other embodiment, the resistance ($R_D$) may be useful for other applications of PIN diodes (e.g., in a variable attenuator).

Figure 6:
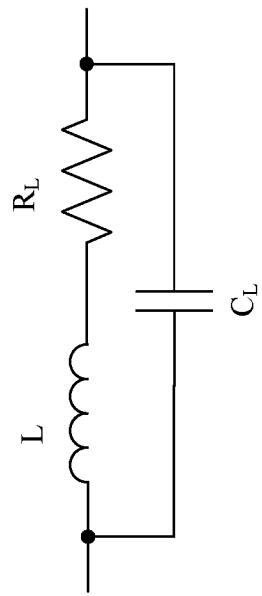
FIG. 6 is a circuit diagram of an embodiment of a model for the inductor from the switch module of FIG. 4.

Each inductor L1-L3 can have a parasitic capacitance ($C_L$) in parallel with a series connected inductance (L) and parasitic resistance ($R_L$) as shown in FIG. 6. The parasitic resistance ($R_L$) corresponds to the resistance of the wire and the parasitic capacitance ($C_L$) is determined from the electric potentials between turns of the wire. At lower frequencies, the parasitic inductance ($L_D$) and parasitic capacitance ($C_L$) are negligible and do not contribute to the insertion loss. In other words, at low frequencies, the reactance of the parasitic capacitor is high and can be ignored in the parallel circuit and the reactance of the parasitic inductor is low and can be ignored in the series circuit. However, at higher frequencies (e.g., RF or microwave frequencies), the parasitic inductance ($L_D$) and parasitic capacitance ($C_L$) become more significant and contribute to the insertion loss of the switch module 350 thereby reducing the performance of the switch module 350.

To reduce (or possibly eliminate) the effects of the parasitic inductance ($L_D$) and parasitic capacitance ($C_L$) on the insertion loss of the switch module 350. The parasitic inductance ($L_D$) and parasitic capacitance ($C_L$) can be configured as a low pass filter that minimizes the effect of the parasitic inductance ($L_D$) and parasitic capacitance ($C_L$) on the insertion loss for the switch module 350 when operated at higher frequencies. In other words, the low pass filter configuration can cancel the effects of the parasitic inductance ($L_D$) and parasitic capacitance ($C_L$) on the insertion loss. The insertion loss for the switch module 350 can then be limited to only the resistance ($R_D$) of the PIN diodes (when in the "on" state) as shown in the equivalent circuit of FIG. 5 due to the cancellation of the effects of the parasitic inductance ($L_D$) and parasitic capacitance ($C_L$) by the low pass filter. The parasitic resistance ($R_L$) has a very low resistance due to a short length of the corresponding pins and bonding wires associated with the inductor and has very little impact on the insertion loss for the switch module 350.

Figure 7:
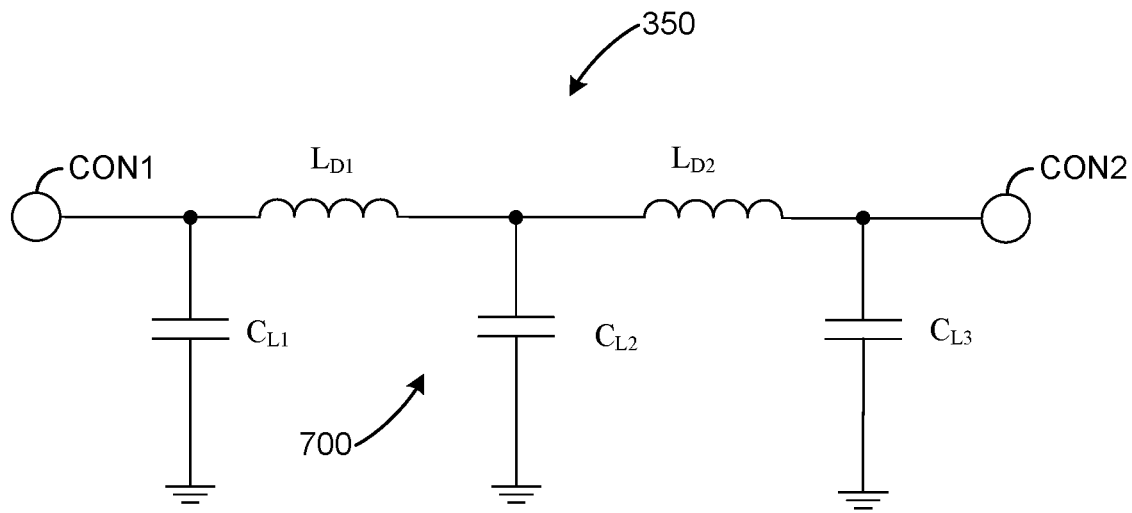
FIG. 7 is a circuit diagram of the switch module of FIG. 4 showing the parasitic inductance and capacitance.

FIG. 7 shows an equivalent circuit for the switch module 350 configured as a low pass filter 700. The equivalent circuit of FIG. 7 shows the parasitic reactances for the PIN diodes D1, D2 and the inductors L1-L3 at RF and microwave frequencies. As shown in FIG. 7, the PIN diodes D1, D2 have been replaced with the corresponding parasitic inductances ($L_{D1}$, $L_{D2}$) for the PIN diodes D1, D2 and the inductors L1-L3 have been replaced with the corresponding parasitic capacitances ($C_{L1}$, $C_{L2}$, $C_{L3}$) for the inductors L1-L3. The resistances ($R_D$) have been omitted from the equivalent circuit for the switch module 350 shown in FIG. 7 for simplicity but do contribute to the insertion loss for the switch module 350. The cut-off frequency of the low pass filter 700 can be above the signal passing frequency band of the switch module 350 (i.e., the range of frequencies passing through the switch module), which provides the low broadband insertion loss for the switch module 350. In other words, any signal passing through the switch module 350 having a frequency below the cutoff frequency of the low pass filter has a low insertion loss. An ideal low pass filter can have a pass band that extends between DC (direct current), or zero frequency, and the cutoff frequency. In the low pass filter shown in FIG. 7, the pass band of the filter can be between a fraction of the SRF of the inductors and the cutoff frequency of the low pass filter. However, below the SRF of the inductors, the low pass filter shown in FIG. 7 is not available as the inductors L1-L3 of the switch module 350 operate as inductors (instead of operating as capacitors which are needed for the low pass filter). The low frequency limit for the low pass filter shown in FIG. 7 starts below the SRF of the inductors and there is a smooth transition into the low pass filter at the SRF point of the inductors. The pass band for the switch module 350 can be a few octaves, where one octave is when $F_{high}=F_{low}*2$. In an embodiment, the operational pass band for the switch module 350 incorporating the low pass filter of FIG. 7 is between the SRF of the inductors and the cutoff frequency for the low pass filter.

Figure 8:
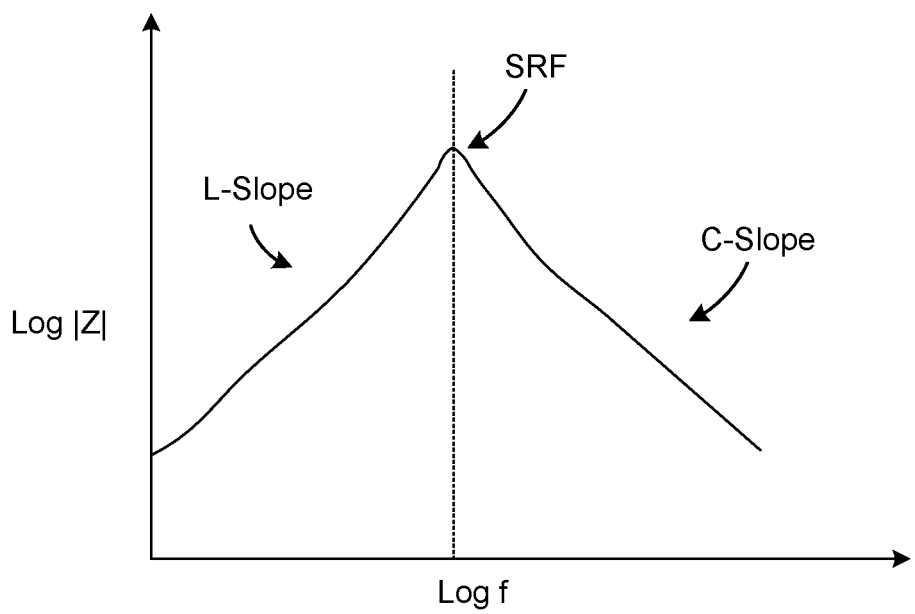
FIG. 8 is a graph showing an embodiment of the frequency response of an inductor.

As mentioned previously, the equivalent circuit for the switch module 350 shown in FIG. 7 is only applicable when the inductors L1-L3 are operated at a frequency above the self-resonant frequency (SRF) for the inductors L1-L3. In one embodiment, the SRF can be calculated as $1/(2*\pi\sqrt{L*C_L})$. The inductors L1-L3 have a reactance that rises with frequency, and at the SRF, the inductors L1-L3 behave as a parallel resonant circuit because the reactance associated with the inductance of the inductors L1-L3 matches the reactance associated with the parasitic capacitance of the inductors L1-L3. At inductance from the at least one PIN dioassociated with the parasitic capacitance of the inductors L1-L3 is the dominant part of the inductor's impedance and inductors L1-L3 operate like capacitors. FIG. 8 shows a graph of an embodiment of the frequency response of an inductor. As shown in FIG. 8, the inductor has increasing impedance (and operates like an inductor) with frequency (e.g., the L-Slope of the graph) until the self-resonant frequency (SRF) is reached. After the SRF has been reached, the inductor has decreasing impedance (and operates like a capacitor) with frequency (e.g., the C-Slope of the graph). Thus, the inductors L1-L3 have to be operated in the C-Slope region for the low pass filter of FIG. 7 to be applicable.

Figure 9:
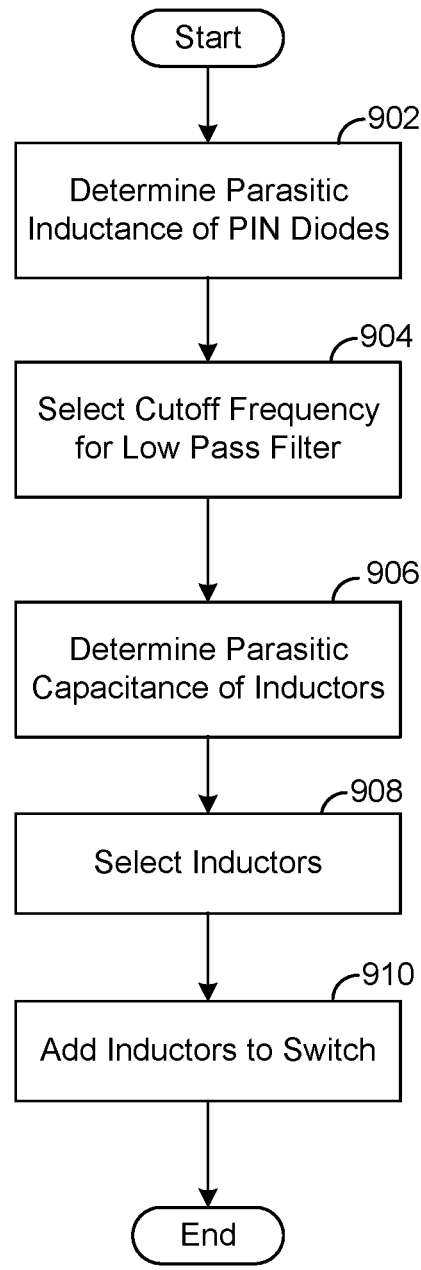
FIG. 9 is a flowchart showing an embodiment of a process for arranging a switch module.

FIG. 9 is directed to an embodiment of a process for arranging a switch module 350. The process begins by determining the parasitic inductance for the PIN diodes (step 902) of the switch module 350. In one embodiment, the parasitic inductance for the PIN diodes can be determined (at the frequency band of the signals passing through the switch module 350) using a Vector Network Analyzer (VNA). However, any suitable technique for determining the parasitic inductance of the PIN diodes can be used in other embodiments. Next, the cutoff frequency is selected for the low pass filter to be formed from the parasitic inductances and capacitances of the PIN diodes D1, D2 and the inductors L1-L3 at the frequency band of the signals passing through the switch module 350 (step 904). The cutoff frequency for the low pass filter can be selected based on the determined parasitic inductance of the PIN diodes and the frequency band of the signals passing through the switch module 350 (i.e., the cutoff frequency can be selected to be above the frequency band).

Once the cutoff frequency for the low pass filter is selected, the parasitic capacitance of the inductors can be determined (at the frequency band of the signals passing through the switch module 350) (step 906). In an embodiment, the parasitic capacitance for the inductors L1-L3 can be determined based on the selected cutoff frequency for the low pass filter and the determined parasitic inductance for the PIN diodes. Each of the inductors L1-L3 for the switch module 350 can then be selected (step 908) based on the SRF of the inductor and the determined parasitic capacitance for the inductor. In one embodiment, inductors L1 and L3 can have the same inductance value, with inductor L2 having a different inductance value such that the corresponding parasitic capacitance in the middle of the low pass filter (i.e., the parasitic capacitance for inductor L2) is different from the parasitic capacitance on the edges of the low pass filter (i.e., the parasitic capacitance for inductors L1 and L3). Each of the inductors L1-L3 are selected to have an SRF that is below the selected operating frequency band for the signals passing through the switch module 350 such that the inductors L1-L3 operate in the C-slope region. In one embodiment, the inductors L1-L3 can be selected to have an inductance based on a corresponding reactance for the inductor that is 4 to 5 times greater than the characteristic impedance of a transmission line connected to the switch module 350. The selected inductors L1-L3 and PIN diodes D1, D2 can then be incorporated into the switch module 350 (step 910) and the process ends.

Although the figures herein may show a specific order of method steps, the order of the steps may differ from what is depicted. Also, two or more steps may be performed concurrently or with partial concurrence. Variations in step performance can depend on the software and hardware systems chosen and on designer choice. All such variations are within the scope of the application. Software implementations could be accomplished with standard programming techniques, with rule based logic and other logic to accomplish the various connection steps, processing steps, comparison steps and decision steps.

It should be understood that the identified embodiments are offered by way of example only. Other substitutions, modifications, changes and omissions may be made in the design, operating conditions and arrangement of the embodiments without departing from the scope of the present application. Accordingly, the present application is not limited to a particular embodiment, but extends to various modifications that nevertheless fall within the scope of the application. It should also be understood that the phraseology and terminology employed herein is for the purpose of description only and should not be regarded as limiting.

What is claimed is:

1. A switch module for a communication device comprising:
   a first connection point and a second connection point opposite the first connection point;
   at least one PIN diode connected in series between the first connection point and the second connection point, the at least one PIN diode having a first state to permit a signal to pass between the first connection point and the second connection point and second state to prevent the signal from passing between the first connection point and the second connection point; and
   a biasing circuit connected to the at least one PIN diode to control the at least one PIN diode to be in the first state or the second state, the biasing circuit comprising:
      a biasing voltage; and
      a plurality of inductors connected in parallel to the at least one PIN diode, wherein each inductor of the plurality of inductors has a self-resonant frequency that is less than an operating frequency of the signal passing between the first connection point and the second connection point and each inductor of the plurality of inductors includes a parasitic capacitance, and wherein the at least one PIN diode includes a parasitic inductance, and wherein the parasitic inductance from the at least one PIN diode and the parasitic capacitances from the plurality of inductors form a low pass filter for the signal passing between the first connection point and the second connection point.

2. The switch module of claim 1, wherein the low pass filter has a cutoff frequency greater than the operating frequency of the signal passing between the first connection point and the second connection point.

3. The switch module of claim 2, wherein the cutoff frequency of the low pass filter is based on the parasitic inductance from the at least one PIN diode and the parasitic capacitances from the plurality of inductors at the operating frequency of the signal passing between the first connection point and the second connection point.

4. The switch module of claim 1, wherein the signal is one of an RF (radio frequency) signal or a microwave signal.

5. The switch module of claim 1, wherein:
the at least one PIN diode includes a first PIN diode and a second PIN diode connected in series; and
the plurality of inductors includes a first inductor, a second inductor and a third inductor, the first inductor connected in parallel between the first connection point and the first PIN diode, the second inductor connected in parallel between the first PIN diode and the second PIN diode, and the third inductor connected in parallel between the second connection point and the second PIN diode.

6. The switch module of claim 5, wherein the second inductor is connected to the biasing voltage.

7. The switch module of claim 5, wherein the second inductor has an inductance value different from an inductance value for the first inductor and the third inductor.

8. The switch module of claim 1, wherein the biasing voltage provides a first voltage to place the at least one PIN diode in the first state and provides a second voltage to place the at least one PIN diode in the second state, wherein the first voltage is greater than a threshold voltage for the at least one PIN diode and the second voltage is a negative voltage.

9. A method of arranging a switch module for a communication device, the method comprising:
determining a parasitic inductance for at least one PIN diode connected in series between a first connection point and a second connection point opposite the first connection point;
selecting a cutoff frequency for a low pass filter incorporated in the switch module, wherein the cutoff frequency is greater than an operating frequency of the signal passing between the first connection point and the second connection point;
determining a parasitic capacitance for each inductor of a plurality of inductors connected in parallel to the at least one PIN diode;
selecting each inductor of the plurality of inductors, wherein each inductor has a corresponding determined parasitic capacitance for the inductor and a self-resonant frequency that is less than the operating frequency of the signal passing between the first connection point and the second connection point; and
incorporating the selected inductors into the switch module.

10. The method of claim 9, wherein selecting the cutoff frequency includes selecting the cutoff frequency based on the determined parasitic inductance for the at least one PIN diode.

11. The method of claim 9, wherein determining a parasitic capacitance for each inductor of a plurality of inductors includes determining the parasitic capacitance based on the cutoff frequency and the determined parasitic inductance for the at least one PIN diode.

12. The method of claim 9, wherein the parasitic inductance from the at least one PIN diode and the parasitic capacitances from the plurality of inductors form the low pass filter for the signal passing between the first connection point and the second connection point.

13. The method of claim 12, wherein the cutoff frequency of the low pass filter is based on the parasitic inductance from the at least one PIN diode and the parasitic capacitances from the plurality of inductors at the operating frequency of the signal passing between the first connection point and the second connection point.

14. The method of claim 9, wherein the signal is one of an RF (radio frequency) signal or a microwave signal.

15. A communication device comprising:
an antenna;
a transmitter;
a receiver; and
switching circuitry to connect the antenna to one of the transmitter or the receiver, wherein the switching circuitry comprises at least one switch module, wherein the at least one switch module comprises:
a first connection point and a second connection point opposite the first connection point;
at least one PIN diode connected in series between the first connection point and the second connection point, the PIN diode having a first state to permit a signal to pass between the first connection point and the second connection point and second state to prevent the signal from passing between the first connection point and the second connection point; and
a biasing circuit connected to the at least one PIN diode to control the at least one PIN diode to be in the first state or the second state, the biasing circuit comprising:
a biasing voltage; and
a plurality of inductors connected in parallel to the at least one PIN diode, wherein each inductor of the plurality of inductors has a self-resonant frequency that is less than an operating frequency of the signal passing between the first connection point and the second connection point and each inductor of the plurality of inductors includes a parasitic capacitance, and wherein the at least one PIN diode includes a parasitic inductance, and wherein the parasitic inductance from the at least one PIN diode and the parasitic capacitances from the plurality of inductors form a low pass filter for the signal passing between the first connection point and the second connection point.

16. The communication device of claim 15, wherein the low pass filter has a cutoff frequency greater than the operating frequency of the signal passing between the first connection point and the second connection point.

17. The communication device of claim 16, wherein the cutoff frequency of the low pass filter is based on the parasitic inductance from the at least one PIN diode and the parasitic capacitances from the plurality of inductors at the operating frequency of the signal passing between the first connection point and the second connection point.

18. The communication device of claim 15, further comprising filtering circuitry configured to filter a signal travelling between the antenna and the transmitter or the receiver.

* * * * *